(12) United States Patent
Nakari

(10) Patent No.: US 11,469,749 B2
(45) Date of Patent: Oct. 11, 2022

(54) POWER CONTROLLER CONFIGURED TO DISTINGUISH AN INTENTIONAL SIGNAL ASSOCIATED WITH A MANUAL RESCUE MODE FROM AN UNINTENTIONAL SIGNAL ASSOCIATED WITH A SHORT CIRCUIT

(71) Applicant: Kone Corporation, Helsinki (FI)

(72) Inventor: Arto Nakari, Hyvinkaa (FI)

(73) Assignee: Kone Corporation, Helsinki (FI)

(*) Notice: Subject to any disclaimer, the term of this patent is extended or adjusted under 35 U.S.C. 154(b) by 542 days.

(21) Appl. No.: 15/850,209

(22) Filed: Dec. 21, 2017

(65) Prior Publication Data

US 2018/0198441 A1 Jul. 12, 2018

(30) Foreign Application Priority Data

Jan. 9, 2017 (EP) .................................... 17150657

(51) Int. Cl.
| | | |
|---|---|---|
| B66B 1/32 | (2006.01) | |
| B66B 1/34 | (2006.01) | |
| B66B 5/02 | (2006.01) | |
| H03K 7/08 | (2006.01) | |
| B66B 1/28 | (2006.01) | |
| B66B 25/00 | (2006.01) | |

(52) U.S. Cl.
CPC ................ H03K 7/08 (2013.01); B66B 1/28 (2013.01); B66B 1/32 (2013.01); B66B 1/3453 (2013.01); B66B 1/3461 (2013.01); B66B 5/028 (2013.01); B66B 25/003 (2013.01); B66B 25/00 (2013.01); Y02B 50/00 (2013.01)

(58) Field of Classification Search
CPC .......... H03K 7/08; B66B 1/3476; B66B 1/44; B66B 5/18; B66B 1/46; B66B 1/32; B66B 2201/46; B66B 5/028

USPC ........ 187/247, 277, 391, 396, 289; 340/502, 340/512, 5.1, 5.2, 5.21, 5.26, 5.51, 5.6, 340/5.61, 5.65, 5.8
See application file for complete search history.

(56) References Cited

U.S. PATENT DOCUMENTS

| | | | | |
|---|---|---|---|---|
| 4,102,436 A | * | 7/1978 | Kernick | .................. B66B 1/285 187/293 |
| 5,125,481 A | * | 6/1992 | Shibata | ..................... B66B 9/00 187/245 |
| 5,625,266 A | * | 4/1997 | Stark | .................. G05B 19/0428 318/466 |

(Continued)

FOREIGN PATENT DOCUMENTS

| WO | WO-2007/125155 A1 | 11/2007 |
|---|---|---|
| WO | WO-2016/113471 A1 | 7/2016 |

OTHER PUBLICATIONS

CA Extended European Search Report #17150657.9 dated Jul. 25, 2017.

*Primary Examiner* — Christopher Uhlir
(74) *Attorney, Agent, or Firm* — Harness, Dickey & Pierce, P.L.C.

(57) ABSTRACT

A power controller with a cable connected remote controlling device configured to transmit a pulsed instruction signal according to a predetermined signal pattern to the power controller. The power controller determines if the instruction signal corresponds with a predetermined signal pattern. If the instruction signal corresponds with a predetermined signal pattern, the controller passes the instruction signal to switches that control power supply of an electric device.

21 Claims, 3 Drawing Sheets

(56) References Cited

U.S. PATENT DOCUMENTS

| | | | | |
|---|---|---|---|---|
| 5,648,645 A * | 7/1997 | Arpagaus | ............... | B66B 1/3492 187/393 |
| 6,000,505 A * | 12/1999 | Allen | ................... | G06Q 90/205 187/391 |
| 6,364,066 B1 * | 4/2002 | Bolch | ................... | B66B 5/0018 187/391 |
| 7,448,473 B2 * | 11/2008 | Lindberg | ................... | B66B 1/34 187/384 |
| 9,051,155 B2 * | 6/2015 | Herkel | ....................... | B66B 1/34 |
| 9,850,093 B2 * | 12/2017 | DePaola | ................... | B66B 1/468 |
| 10,189,676 B2 * | 1/2019 | Hovi | ....................... | B66B 5/027 |
| 2006/0060427 A1 * | 3/2006 | Chida | ................... | B66B 1/3453 187/247 |
| 2009/0178889 A1 * | 7/2009 | Harkonen | ................. | B66B 1/28 187/373 |
| 2009/0288920 A1 * | 11/2009 | Kattainen | ................. | B66B 5/04 187/287 |
| 2012/0136668 A1 * | 5/2012 | Kuroda | ................... | B66B 1/468 704/275 |
| 2013/0233657 A1 * | 9/2013 | Kattainen | ............... | H02P 15/00 188/156 |
| 2015/0053507 A1 * | 2/2015 | Kattainen | ................. | B66B 1/32 187/288 |
| 2015/0136530 A1 * | 5/2015 | Rui | ........................... | B66B 1/32 187/288 |
| 2015/0274486 A1 * | 10/2015 | Wilke | ................... | B66B 5/0025 187/391 |

* cited by examiner

POWER CONTROLLER CONFIGURED TO DISTINGUISH AN INTENTIONAL SIGNAL ASSOCIATED WITH A MANUAL RESCUE MODE FROM AN UNINTENTIONAL SIGNAL ASSOCIATED WITH A SHORT CIRCUIT

DESCRIPTION OF BACKGROUND

This application claims priority to European Patent Application No. EP171506579 filed on Jan. 9, 2017, the entire contents of which are incorporated herein by reference.

The following disclosure relates to operating electro-mechanical devices and systems. Particularly, the following disclosure relates to operating electro-mechanical devices and systems using a power controller. Arrangements disclosed in the following disclosure are suitable for various different applications involving electro-mechanical devices.

Electro-mechanical devices are widely used in a plurality of applications. In many conventional approaches, electro-mechanical devices are also controlled using an analog electronic controller, because it is established technology and more complicated digital technology is not needed. Sometimes these analog electric controlling devices are used as a backup for digital controlling devices, as they are often more fault tolerant or they can be implemented using different physical parts, so that if the principal device breaks, the backup device can be fully functional.

One example of an application using electro-mechanical devices is the elevator. Elevators come in different sizes and are operating in various operating conditions. Furthermore, elevators are established technology. Thus, some installations that are still in use are very old. It is obvious that operation faults occur every once in a while. Because elevator safety is an important issue, it is regulated in many market areas.

One important issue in regulations is to keep elevators safe in case of a power outage. A common approach to provide elevator brakes is to use electro-magnetic brakes that are kept open using power. When the elevator is stopped, the brakes are engaged by cutting the power. Engaged brakes will keep the elevator stationary. Thus, in case of a power outage the elevator brakes are automatically engaged, and if the elevator car is moving, it will immediately stop.

Another important issue in regulations is to provide means for bringing passengers out of the elevator if the elevator stops because of a fault, or for example, because of a power outage. A conventional approach is to provide a manual rescue mode, wherein the safety circuit of the elevator is bypassed. Then the brakes are manually disengaged and the elevator will be moved using gravity. Then the elevator car is stopped at the next suitable floor and the passengers can get out of the elevator car.

One known solution is to provide a manual controlling device that is located near the controlled device, such as the brakes of the elevator. In another approach the controlling device is located at a distance from the controlled device. The connection between the devices is arranged using electric wires or other wired connection. Then, the controlling device may be used to short circuit, for example by pressing two buttons, the electric wire connection, so that reserve power is used to release the brakes.

SUMMARY

In the following disclosure, a power controller with a cable connected remote controlling device is disclosed. The remote controlling device is configured to transmit a pulsed instruction signal according to a predetermined signal pattern to the power controller. The power controller determines if the instruction signal corresponds with a predetermined signal pattern. If the instruction signal corresponds with a predetermined signal pattern, the controller passes the instruction signal to switches that control the power supply of an electric device.

In an aspect of the power controller a method for controlling power supply of an electric device is disclosed. The method comprises controlling the power supply of an electric device using at least one switch, wherein the switch is controlled using an instruction signal; receiving an instruction signal; and comparing the instruction signal with at least one predetermined instruction signal pattern. When the received instruction signal corresponds with the at least one predetermined instruction signal pattern, the method further comprises providing the instruction signal to the at least one switch. The use of particular instruction signal provides the possibility to separate unintentional signals from intentional signals.

In an embodiment the instruction signal is a pulsed signal. A pulsed signal is easy to measure and can be used, for example, to control relays. In a further embodiment the electric device is an elevator or escalator. In a further embodiment the comparing is performed using a processor. In another embodiment comparing is performed using an electronic comparing device. In a further embodiment the method further comprises transmitting a pulsed signal using a remote controlling device.

In an aspect of the power controller a computer program configured to cause the method described above when the computer program is executed in a computing device.

In an aspect of the power controller an apparatus is disclosed. The apparatus comprises at least one switch configured to control power supply to an electric device according to an instruction signal; and a circuitry configured to receive and compare the instruction signal with at least one predetermined instruction signal pattern. When the instruction signal corresponds with the at least one predetermined instruction signal pattern, the circuitry is configured to provide the instruction signal to the at least one switch. The use of particular instruction signal provides the possibility to separate unintentional signals from intentional signals.

In an embodiment the circuitry comprises at least one processor. It is beneficial to use a processor for comparing as processors are capable of recognizing various patterns and typically many electronic controllers already have a programmable processor. This provides cost savings in the implementation. In another embodiment the circuitry is an electronic comparator circuit configured to pass a predetermined signal pattern. It is beneficial to use electronic, which may be also analog, comparators as they are simple to implement, fault tolerant and may be constructed to be independent from the rest of the controlling devices.

In an aspect of the power controller a system is disclosed. The system comprises an apparatus as described above; a remote controlling device configured to transmit an instruction signal according to a predetermined signal pattern; and an electric conductor arranged between the apparatus and the remote controlling device.

In an aspect of the power controller an elevator comprising a system as described above is disclosed. In an embodiment the electric device is a brake of the elevator.

In an aspect of the power controller an escalator comprising a system as described above is disclosed.

The benefits of described aspects and implementations include possibility to detect unintentional short circuits and intentional signals when using a remote controlling device with a wired connection. Furthermore, the benefits of the power controller as described above include possibility to use different signal patterns for including additional information.

BRIEF DESCRIPTION OF THE DRAWINGS

The accompanying drawings, which are included to provide a further understanding of the power controller and constitute a part of this specification, illustrate embodiments and together with the description help to explain the principles of the power controller. In the drawings.

DETAILED DESCRIPTION

Reference will now be made in detail to the embodiments, examples of which are illustrated in the accompanying drawings.

In the following description, a power controller comprising at least one switch configured to control power supply to an electric device according to an instruction signal and a circuitry configured to receive and compare the instruction signal with at least one predetermined instruction signal pattern is disclosed as a part of a system.

In the following description, the expression power supply is used to mean a power connection that is capable of providing power to the controller electric device under normal circumstances. Thus, the actual power needed varies according to the controlled electric device. In the following description, the expression instruction signal is used to mean a signal that can be used for signaling purposes but would not be sufficient for operating the electric device. A device generating such instruction signal may be, for example, powered by a battery. In the following description, a predetermined signal pattern or a pulsed signal is used to mean a signal that is formed of duty and off-time cycles instead of a continuous signal. Off-time cycles between duty signals can be used for determining that the signal is intentional. Thus, it is possible to separate intentional signals from unintentional signals that may be caused by a short circuit.

Figure 1:
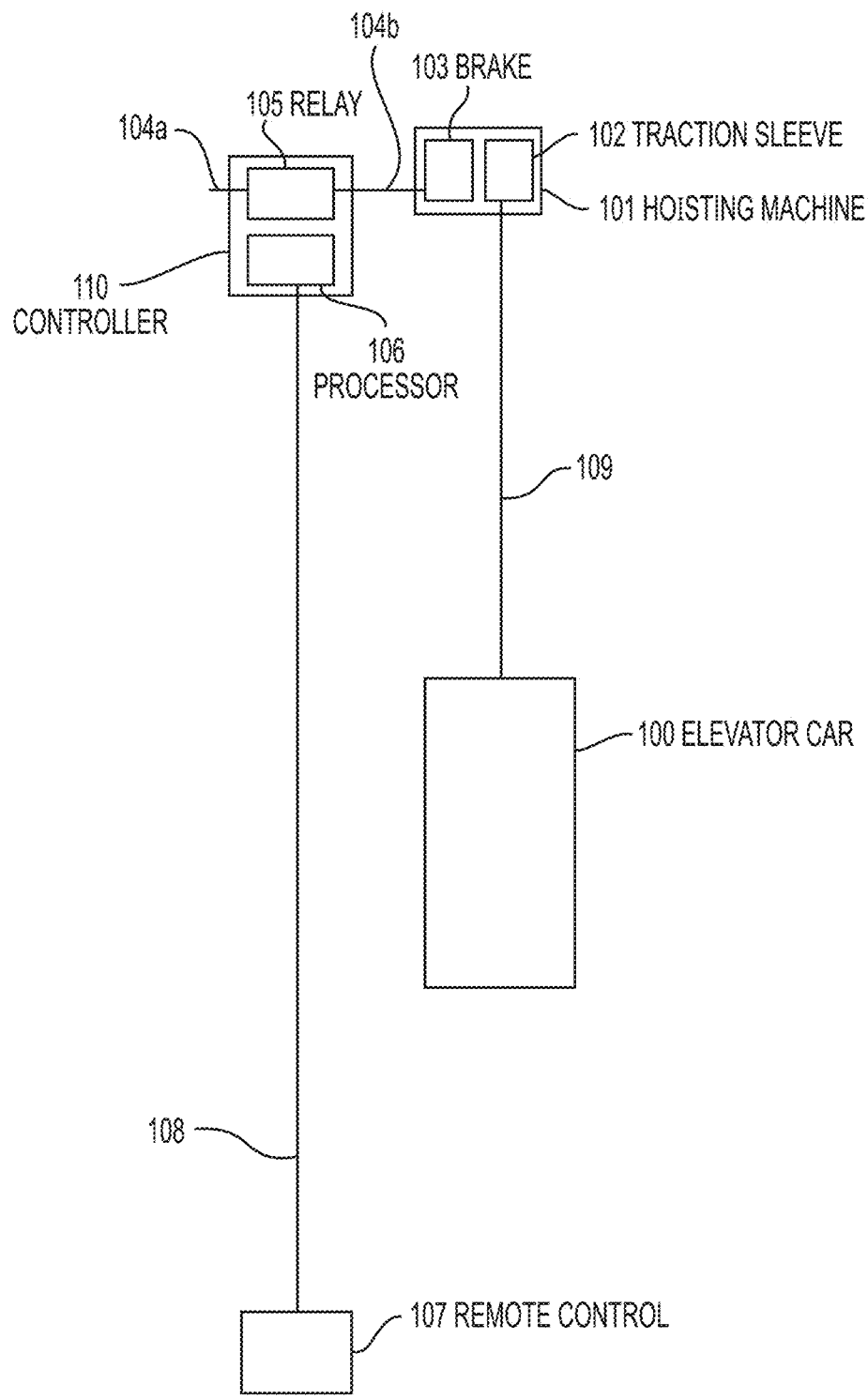
FIG. 1 is an example of a system using a power controller.

In FIG. 1 an example of an embodiment is disclosed. In FIG. 1, an elevator car 100 is operated by a hoisting machine 101. The hoisting machine 101 is connected to the elevator car by hoisting ropes 109. The hoisting ropes 109 are typically arranged so that one end is connected to a counterweight; however, this is not necessary. In the example of FIG. 1, hoisting ropes 109 are arranged around a traction sheave 102 that is coupled to a hoisting motor. The elevator is operated by rotating the traction sheave 102 so that the elevator car will travel downwards or upwards.

The hoisting machine 101 further comprises a brake 103 that is a conventional elevator brake. Thus, when the elevator car 100 is moving, electricity is conducted to the magnets of the brake so that the brake 103 is maintained open and the elevator car 100 can move. When the elevator stops, the electricity is cut off and the magnets will force the brake 103 on, so that the elevator car 101 will stop and stay stationary. The hoisting machine is connected to conventional operation logic that will provide instructions to the hoisting machine 101 for moving the elevator car according to a received call. It is common that an elevator comprises two or even more brakes instead of just one brake. In this disclosure the expression "brake" is used to mean the whole braking arrangement comprising one or more actual brakes.

As described above, elevator brakes are typically arranged so that in case of power outage, the magnets will close the brake and the elevator car is stopped. This is necessary because in case of unintentional power outage, the hoisting machine 101 cannot maintain the movement of the elevator car 100, and the elevator car 100 will rush to the bottom or top of the elevator shaft, depending on the balance between the elevator car and the counterweight.

In case of an unintentional stop of the elevator car 100 it is necessary to open the brake 103, so that the elevator car 100 will move to the next floor. When the elevator car 100 has reached the floor, passengers can be let out of the elevator car 100. The moving of the elevator car 100 can be actuated using a remote controlling device 107. In the example of FIG. 1, the remote controlling device 107 is located on the ground floor, so that the maintenance man does not need to climb to the hoisting machine. The remote controlling device 107 is connected to a controller 110. The controller 110 may be a special purpose device only for manual rescue, or it can be arranged in the elevator controller and share some resources. In the example of FIG. 1, a reserve power connection 104a provides electricity to the controller 110 and the hoisting machine 101.

In the example of FIG. 1, only reserve power connection 104a is shown; however, the controller may also be controlling the normal power supply which may be using separate electric wires. The reserve power connection does not need to have the same capacity as the normal power supply. The normal power supply needs to be able to use the hoisting machine in both directions under all load conditions. It is sufficient for the reserve power connection 104a to be able to operate the controller 110 and to open the brake 103 so that the elevator car 100 will move to the next floor using gravity.

As described above, the remote controlling device 107 may be located on the ground floor or any other chosen floor. The remote controlling device 107 is connected to the controller 110 by an electric cable 108. As the building may be high, the electric cable may be long, for example over hundred meters. The electric cable 108 is used to transmit the instruction signal to the controller 110 that will control the reserve power connection 104a. When the remote controlling device 107 sends an instruction signal over the electric cable 108, the controller 110 will let the reserve power 104b to flow through to the brake 103 so that the brake 103 opens.

For controlling, it is conventional to use relays 105 or other similar switches that are commonly used to control power using instruction signals. The relays 105 receive an instruction signal from the remote controlling device 107. Thus, when the relays 105 receive the instruction signal from the remote controlling device 107, the relays 105 will let the reserve power to flow to the brake 103.

Figure 2:
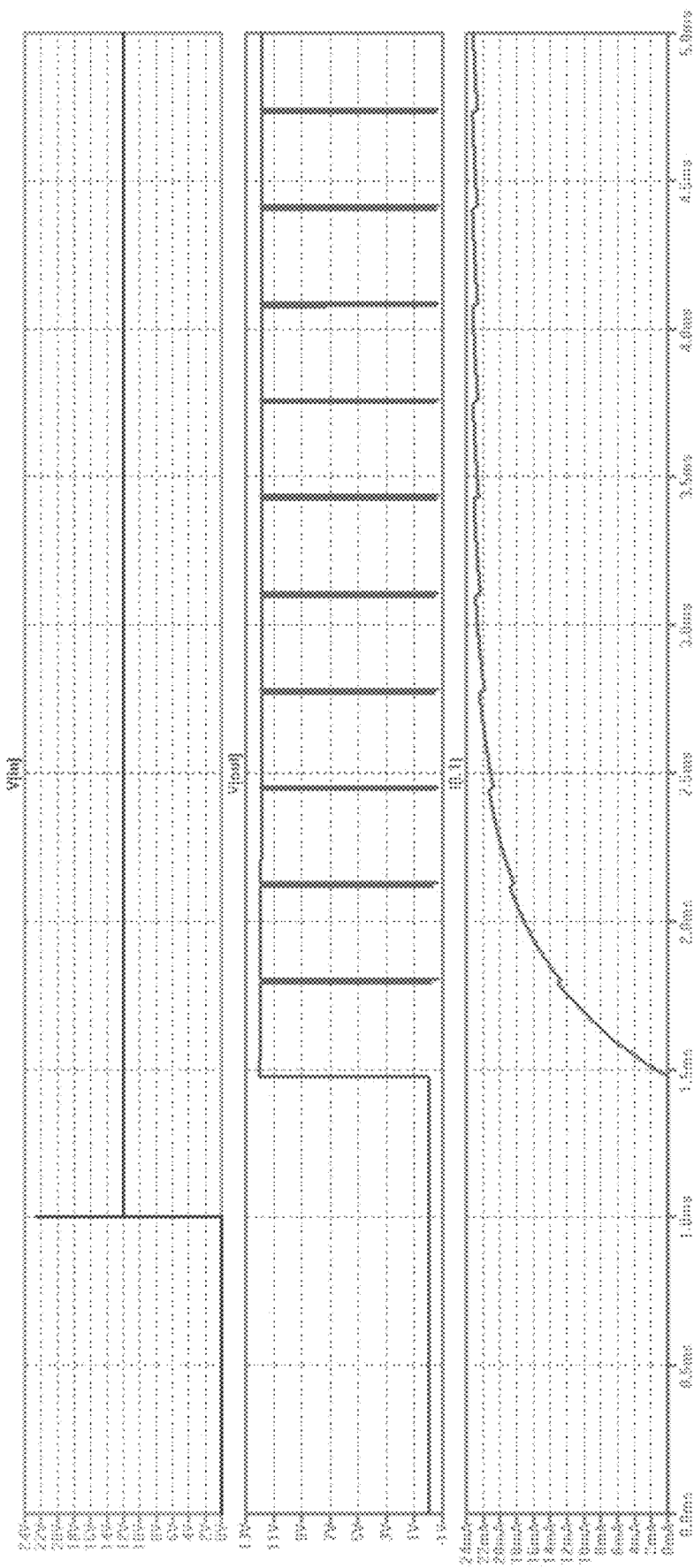
FIG. 2 is a graph illustrating an example of an instruction signal and the behavior of the system.

In the example of FIG. 1, the remote controlling device 107 transmits a pulsed instruction signal to the controller 110. The pulsed instruction signal should be chosen so that the relay coil current reaches a value that is enough to let the reserve power to flow. For example, the cycle may be 95% duty and 5% off as shown in FIG. 2, which will be explained in more detail below.

In the example of FIG. 1, the controller 110 further comprises a processor 106 that is configured to monitor the instruction signal received from the remote controlling device 107. The processor is configured to monitor the instruction signal and compare it with a least one predetermined instruction signal pattern. If the instruction signal does not match with the predetermined signal, the processor is configured to prevent the flow of the signal, so that it will never reach relays 105 and the brake 103 is not opened. The use of a predetermined pattern prevents the opening of the brake 103 in case that the instruction signal is caused by an unintentional short circuit of the electric cable 108 that may cause a continuous instruction signal or random impulses that are enough to raise the coil current high enough to let the reserve power 104b to flow.

In the example of FIG. 1, a processor is used; however, it is possible to produce a special purpose device that will let only predetermined signals through. These devices are called comparators and they can be used for comparing different signal properties. Using a separate device may be beneficial if a processor is not available in the controller 110. This may be the case, for example, when the controller is a special purpose security device dedicated to serve as a backup.

In the above, use of a pulsed signal for controlling an apparatus is described. In the example, an elevator is described; however, the arrangement is also suitable for other purposes, such as gates, escalators and similar. In the above, the arrangement is described as a safety measure to be used in a manual operation mode; however, a similar arrangement can also be used as a primary operation mode where the simple signal is enough. Furthermore, it is possible to use several different patterns in the instruction signal for encoding more information that can be associated with functionality.

In FIG. 2, three graphs according to an example are shown. The topmost graph shows the pulse-width modulator integrated circuit supply voltage which is rising up when an activation push button is pressed. The graph in the middle shows output of the pulse-width modulator which is to supply voltage for relay coils with a 95% duty cycle. The lowest graph shows the relay coil current which reaches the full value despite the small off time of 5%. The signal shown in the middle can be detected by using a processor or specific circuitry configured to detect such signal. It can be seen from the lowest figure that the relay coil current reaches the full value and stays at a high level. The cycle of 95%-5% described above is intended to be only an example, and also other cycles may be used.

Figure 3:
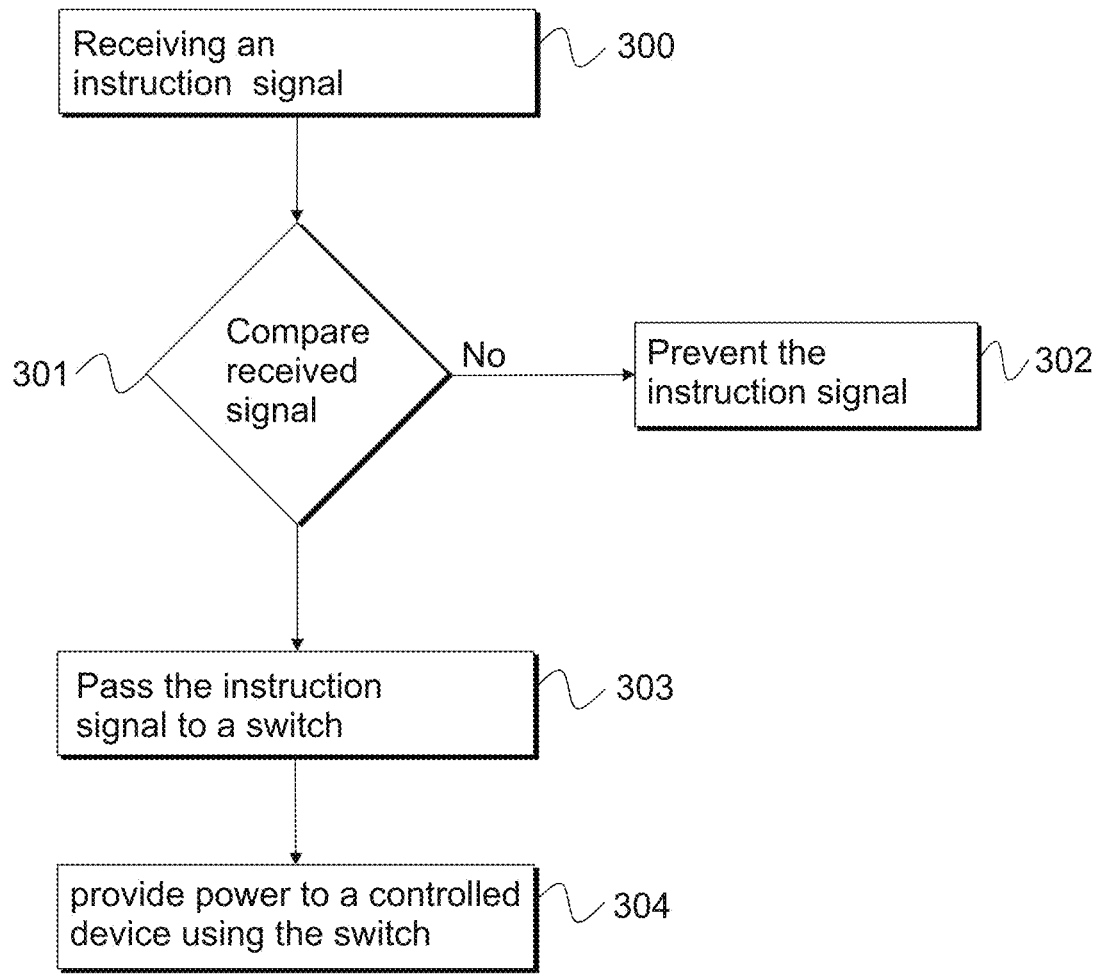
FIG. 3 is a flow chart of a method using a power controller.

FIG. 3 discloses a method according to an example. In the example, the method is performed in a controller similar to the controller of FIG. 1. The controller 110 is configured to perform the method when a manual rescue mode is applied. Thus, before the first step a plurality of preparatory steps may need to be taken. For example, a maintenance man may have to prepare the reserve power capacity. This can be done in several ways, for example by starting a generator. It is, however, possible that the reserve power initialization is automatic. Furthermore, the maintenance man has to switch into a manual operating mode and give instructions by using a remote controlling device. It is also possible that in some situations the maintenance man performs these steps remotely, for example from a central controlling facility serving all elevators of the building or a group of buildings. In case of elevators it may also be regulated that each elevator must be equipped with a dedicated remote controlling device. If the controller is used for controlling gates, doors or other similar devices there is no need to change into manual rescue mode but the operation may be the normal operation mode. For example, if a gate is operated using an electric cable, an extra layer of security may be added so that the gate will not open if the electric cable for some reason short circuits. It is possible that this arrangement is also used in other applications as a backup, for example, for a fully digital arrangement. A benefit of using the described arrangement is that the electric cable provides fast response when sending instructions over the electric cable.

The method of FIG. 3 is initiated when a controller receives an instruction signal, step 300. The instruction signal is received from an electric cable connected to the controller. It is assumed that the instruction signal is sent by a remote controlling device, but it can also be an erroneous signal generated by short circuit in the cable. Erroneous signals are typically constantly connected or produce signals that have irregular duty/off cycles.

When the instruction signal is received, it is compared against predetermined signal patterns, step 301. For example, it is possible that the remote controlling device can send only a signal having 95% duty and 5% off time. If the received pattern matches one of the predetermined patterns, it is assumed that the instruction signal has been sent by the remote controlling device. There may be more than one pattern and different patterns may be used for connecting different devices. For example, one remote controlling device could be used for controlling two different devices, such as elevators, through one controller, so that the signal pattern for the first device is different from the signal pattern of the second device.

If the result of the comparison is negative, the flow of the instruction signal 302 is prevented. Thus, it is assumed that the signal is erroneous and should not be passed further. If the result of the comparison is positive the signal is passed further to a switch, step 303.

The comparison may be made using a processor for analyzing the signal. The comparison may also be made using a special purpose circuitry. If there are more than one predetermined signal, additional switches may be used for providing the instruction signal to the switch controlling the desired device.

Finally, the instruction signal is received at one or more switches controlling the power supply of the controlled device. These switches may be relays or other switches that can be controlled by using an instruction signal. The switch connects the power supply to the controlled device so that the controlled device is controlled according to the instructions given by the maintenance man.

The above mentioned method may be implemented as computer software which is executed in a computing device. When the software is executed in a computing device, it is configured to perform the above described inventive method. The software is embodied on a computer readable medium so that it can be provided to the computing device, such as the controller 110 of FIG. 1.

As stated above, the components of the exemplary embodiments can include a computer readable medium or memories for holding instructions programmed according to the teachings of the present embodiments and for holding data structures, tables, records, and/or other data described herein. A computer readable medium can include any suitable medium that participates in providing instructions to a processor for execution. Common forms of computer-readable media can include, for example, a floppy disk, a flexible disk, hard disk, magnetic tape, any other suitable magnetic medium, a CD-ROM, CD±R, CD±RW, DVD, DVD-RAM, DVD±RW, DVD±R, HD DVD, HD DVD-R, HD DVD-RW, HD DVD-RAM, Blu-ray Disc, any other suitable optical medium, a RAM, a PROM, an EPROM, a FLASH-EPROM, any other suitable memory chip or cartridge, a carrier wave or any other suitable medium from which a computer can read.

It is obvious to a person skilled in the art that with the advancement of technology, the basic idea of the power controller may be implemented in various ways. The power controller and its embodiments are thus not limited to the examples described above; instead they may vary within the scope of the claims.

The invention claimed is:

1. A method of controlling at least one switch to provide a power supply to an electric device, the method comprising:
receiving, by a controller, a signal, the signal being a pulsed instruction signal from a remote controlling device or an erroneous signal from another source;
comparing, by the controller, the signal with at least one predetermined instruction signal pattern to determine whether the received signal corresponds with the at least one predetermined instruction signal pattern; and
selectively relaying, by the controller, the pulsed instruction signal to the at least one switch as a relayed pulsed instruction signal in response to the signal corresponding with the at least one predetermined instruction signal pattern such that (i) the signal is not provided to the at least one switch in response to the signal not corresponding with the at least one predetermined instruction signal pattern and (ii) the relayed pulsed instruction signal relayed to the at least one switch has a same duty cycle as the pulsed instruction signal in response to the signal corresponding with the at least one predetermined instruction signal pattern, wherein the at least one switch is configured to provide the power supply to the electric device in response to receipt of the pulsed instruction signal relayed thereto.

2. The method according to claim 1, wherein the electric device is a brake of an elevator car where the brake and the remote controlling device are connected via an electric conductor such that the remote controlling device is physically separated from the elevator car, wherein the receiving comprises:
receiving, the signal via the electric conductor such that the received signal is the pulsed instruction signal in response to a user of the remote controlling device located outside of the elevator car instructing the remote controlling device to transmit the pulsed instruction signal.

3. The method according to claim 1, wherein the comparing is performed using a processor.

4. The method according to claim 1, wherein the comparing is performed using an electronic comparing device.

5. The method according to claim 1, wherein the method further comprises:
transmitting, by the remote controlling device, the pulsed instruction signal having the at least one predetermined instruction signal pattern required by the controller to relay same to the at least one switch.

6. A non-transitory computer readable medium storing a computer program that, when executed by the controller, configures the controller to perform the method according to claim 1.

7. An apparatus comprising:
at least one switch configured to provide a power supply to an electric device in response to receipt of a pulsed instruction signal relayed thereto; and
a controller configured to,
receive a signal, the signal being the pulsed instruction signal from a remote controlling device or an erroneous signal from another source,
compare the signal with at least one predetermined instruction signal pattern to determine whether the signal corresponds with the at least one predetermined instruction signal pattern, and
selectively relay the pulsed instruction signal to the at least one switch as a relayed pulsed instruction signal in response to the received signal corresponding with the at least one predetermined instruction signal pattern such that (i) the signal is not provided to the at least one switch in response to the signal not corresponding with the at least one predetermined instruction signal pattern and (ii) the relayed pulsed instruction signal relayed to the at least one switch has a same duty cycle as the pulsed instruction signal in response to the signal corresponding with the at least one predetermined instruction signal pattern.

8. The apparatus according to claim 7, wherein the controller comprises:
at least one processor.

9. The apparatus according to claim 7, wherein the controller is an electronic comparator circuit configured to relay the pulsed instruction signal in response to the pulsed instruction signal matching the at least one predetermined instruction signal pattern.

10. A system comprising:
the apparatus according to claim 7 configured to provide the power supply to a brake of a device in response to receipt of the pulsed instruction signal relayed thereto from the remote controlling device;
the remote controlling device configured to transmit the pulsed instruction signal having the at least one predetermined instruction signal pattern required by the controller to relay same to the at least one switch, in response to a user of the remote controlling device instructing the remote controlling device to transmit the pulsed instruction signal; and
an electric conductor between the apparatus and the remote controlling device such that the remote controlling device is physically separated from the device and provides the pulsed instruction signal to the apparatus via the electric conductor.

11. An elevator comprising:
the system according to claim 10.

12. The elevator according to claim 11, wherein said electric device is a brake of the elevator such that the at least one switch is configured to provide the power supply to the brake in response to receipt of the pulsed instruction signal relayed thereto.

13. An escalator comprising:
the system according to claim 10.

14. The method according to claim 1, wherein the selectively relaying blocks relaying of the signal in response to the pulsed instruction signal not corresponding with the at least one predetermined instruction signal pattern.

15. The method according to claim 1, wherein the remote controlling device is configured to transmit the pulsed instruction signal having a set duty cycle, and the comparing comprises:
determining whether the signal received by the controller is the pulsed instruction signal from the remote controlling device or the erroneous signal based on whether the signal received by the controller has the set duty cycle.

16. The method according to claim 1, wherein the at least one switch is a relay configured to allow the power supply to flow to the electric device in response to the pulsed instruction signal.

17. The apparatus according to claim 7, wherein the controller is configured to block relaying of the signal in response to the signal not corresponding with the at least one predetermined instruction signal pattern.

18. The apparatus according to claim 7, wherein
the remote controlling device is configured to transmit the pulsed instruction signal having a set duty cycle, and
the controller is configured to determine whether the signal received by the controller is the pulsed instruction signal from the remote controlling device or the erroneous signal based on whether the signal has the set duty cycle.

19. The apparatus according to claim 7, wherein the at least one switch is a relay configured to allow the power supply to flow to the electric device in response to the pulsed instruction signal.

20. The method of claim 1, wherein the duty cycle of the pulsed instruction signal received from the remote controlling device and the relayed pulsed instruction signal transmitted by the controller to the at least one switch is 95%.

21. The apparatus according to claim 7, wherein the duty cycle of the pulsed instruction signal received from the remote controlling device and the relayed pulsed instruction signal transmitted by the controller to the at least one switch is 95%.

\* \* \* \* \*